United States Patent
Biwa et al.

(10) Patent No.: US 6,576,571 B2
(45) Date of Patent: Jun. 10, 2003

(54) PROCESS OF VAPOR PHASE GROWTH OF NITRIDE SEMICONDUCTOR

(75) Inventors: Goshi Biwa, Kanagawa (JP); Hiroyuki Okuyama, Kanagawa (JP); Masato Doi, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/918,840

(22) Filed: Jul. 31, 2001

(65) Prior Publication Data

US 2002/0048909 A1 Apr. 25, 2002

(30) Foreign Application Priority Data

Aug. 1, 2000 (JP) .................................. 2000-232821

(51) Int. Cl.[7] .............................................. H01L 21/31
(52) U.S. Cl. ...................... 438/791; 438/792; 438/761; 438/680; 438/681; 257/94
(58) Field of Search ................................ 438/791, 792, 438/761, 680, 681; 257/94

(56) References Cited

U.S. PATENT DOCUMENTS

| | | | | |
|---|---|---|---|---|
| 6,153,010 A | * | 11/2000 | Kiyoku et al. | 117/106 |
| 6,156,215 A | * | 12/2000 | Shimada et al. | 216/11 |
| 6,252,255 B1 | * | 6/2001 | Ueta et al. | 257/94 |

FOREIGN PATENT DOCUMENTS

| | | | | |
|---|---|---|---|---|
| JP | 10-062760 | | 11/1998 | |
| JP | 411251253 A | * | 9/1999 | ......... H01L/21/205 |
| JP | 10-176098 | | 1/2000 | |

OTHER PUBLICATIONS

D.Kapolnek, et al., "Spatial control of InGaN luminescence by MOCVD selective epitaxy", J. of Crystal Growth, vol. 189/190, 1998, pp. 83–86.

* cited by examiner

Primary Examiner—Matthew Smith
Assistant Examiner—V. Yevsikov
(74) Attorney, Agent, or Firm—Sonnenschein, Nath & Rosenthal

(57) ABSTRACT

Disclosed herein is a process for vapor phase growth of gallium nitride compound semiconductor which yields uniform crystal layers with good reproducibility. The process comprises forming a first nitride semiconductor layer on a substrate, forming thereon a protective film for crystal growth prevention in such a way that it has partly open window regions through which the first nitride semiconductor layer is exposed, forming a second nitride semiconductor layer by selective growth from the first nitride semiconductor layer at a crystal growth starting temperature, and continuing crystal growth at a temperature higher than the crystal growth starting temperature. The vapor phase growth at a low temperature yields a uniform crystal layer, and the ensuing vapor phase growth at a raised temperature yields a uniform crystal layer with good reproducibility in conformity with the first crystal layer.

11 Claims, 4 Drawing Sheets

PROCESS OF VAPOR PHASE GROWTH OF NITRIDE SEMICONDUCTOR

RELATED APPLICATION DATA

The present application claims priority to Japanese Application No. P2000-232821 filed Aug. 1, 2000, which application is incorporated herein by reference to the extent permitted by law.

BACKGROUND OF THE INVENTION

The present invention relates to a process for crystal growth used to form semiconductor light-emitting devices. More particularly, the present invention relates to a process for selectively growing crystals of nitride semiconductor.

Nitride semiconductors such as gallium nitride compound semiconductors are formed by means of vapor phase growth. Vapor phase growth needs a special process so that it yields high-quality crystals with a low dislocation density, as disclosed in Japanese Patent Laid-open No. Hei 10-312971. According to this disclosure, the process consists of depositing gallium nitride to form a first semiconductor layer, forming a protective film from a material (such as silicon oxide and silicon nitride) which prevents the growth of gallium nitride compound semiconductor, and allowing the gallium nitride compound semiconductor to grow in the lateral direction or in-plane direction from the region which is not covered by the protective film, thereby forming a second semiconductor layer. This layer structure prevents the propagation of the threading dislocations which extend vertically from the substrate interface.

A similar technique is disclosed in MRS Internet J. Nitride Semicond. Res. 4S1, G3.38 (1999). According to this disclosure, the reduction of threading dislocations is accomplished by the steps of growing a first gallium nitride compound semiconductor layer, selectively removing the semiconductor layer by reactive ion etching (RIE for short hereinafter), and selectively growing a second gallium nitride compound semiconductor layer from the remaining crystals. These techniques yield crystal film having a low dislocation density (about $10^6$ cm$^{-2}$), and they have realized long-life semiconductor lasers.

The former technique mentioned above consists of steps of forming a first gallium nitride compound semiconductor layer, forming a protective film, and forming a second gallium nitride compound semiconductor layer. This technique minimizes the propagation of threading dislocations into the second gallium nitride compound semiconductor layer from the underlying layer if the protective film is formed such that the area of windows or the area of uncovered regions in the protective film is as small as possible. In practice, however, the selective growing needs a comparatively high growing temperature (1000° C. or higher) so that deposition on the protective film is as small as possible and because the ordinary growing temperature of GaN is 1000° C. or higher. This high temperature causes vigorous evaporation, retarding the start of crystal growth or growing crystals unevenly if the area of the window region is small. This presents difficulties in achieving uniformity and good reproducibility. Therefore, it is impracticable to reduce the area of the window region and there is a limit to the reduction of the threading dislocation density in the second gallium nitride compound semiconductor layer.

SUAMMARY OF THE INVENITON

It is an object of the present invention to provide a process for vapor phase growth of nitride semiconductor involving a protective film. This process grows high-quality semiconductor crystals uniformly and invariably even though the protective film is so formed as to give small uncovered window regions.

According to the present invention, the process for vapor phase growth of nitride semiconductor includes forming a first nitride semiconductor layer on a substrate, forming thereon a protective film for crystal growth prevention in such a way that it has partly open window regions through which the first nitride semiconductor layer is exposed, forming a second nitride semiconductor layer by selective growth from the first nitride semiconductor layer at a crystal growth starting temperature, and continuing crystal growth at a temperature higher than the crystal growth starting temperature.

According to the present invention, the process for vapor phase growth of nitride semiconductor comprises forming a first nitride semiconductor layer on a substrate, forming thereon a protective film for crystal growth prevention in such a way that it has partly open window regions through which the first nitride semiconductor layer is exposed, forming a second nitride semiconductor layer by selective growth from the first nitride semiconductor layer in such a state that the nitride semiconductor is released at a low level on the surface of the first nitride semiconductor layer or the second nitride semiconductor layer, and continuing crystal growth in such a state that the nitride semiconductor is released on the surface of the second nitride semiconductor layer at a higher level than at the time of start of crystal growth.

The present invention was developed in view of the fact that crystal growth which is usually carried out at a temperature at which crystals do not grow on the protective film or at a temperature at which the reactant gas evaporates does not proceed efficiently in the open window regions of the protective film. The process of the present invention is characterized in that the second nitride semiconductor layer is formed in two stages. The crystal growth is started at an adequate crystal growth starting temperature and is continued at a temperature higher than the crystal growth starting temperature; alternatively, the crystal growth is started in such a state that the nitride semiconductor is released at a low level on the surface of the nitride semiconductor layer and is continued in such a state that the nitride semiconductor is released on the surface of the nitride semiconductor layer at a higher level than at the time of start of crystal growth. In this way it is possible to suppress the evaporation of nitride semiconductor in the window regions.

BRIEF DESCRIPTION OF THE DRAWINGS

FIG. 1A is a sectional view showing the sample in which the GaN layer has been formed. FIG. 1B is a sectional view showing the sample in which the window regions have been formed. FIG. 1C is a sectional view showing the sample in which the GaN layer has been formed at a low temperature.

FIG. 2A is a sectional view showing the sample in which the GaN layer has been formed (grown) at a high temperature. FIG. 2B is a sectional view showing the sample in which the GaN layer has been formed (further grown) at a high temperature.

FIG. 4A is a sectional view showing the sample in which the window regions have been formed. FIG. 4B is a plan view showing the pattern of the window regions.

FIG. 5A is a sectional view showing the sample in which the window regions have been formed. FIG. 5B is a plan view showing the pattern of the window regions.

DESCRIPTION OF THE PREFERRED EMBODIMENTS

Figure 1A:
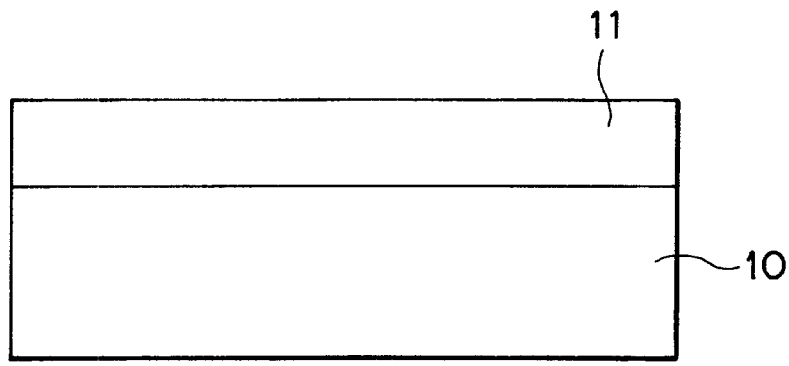
FIGS. 1A to 1C are schematic diagrams to illustrate the steps of vapor phase growth for the nitride semiconductor in Example 1 of the present invention.

According to the present invention, the process for vapor phase growth of nitride semiconductor comprises forming a first nitride semiconductor layer on a substrate, forming thereon a protective film for crystal growth prevention in such a way that it has partly open window regions through which the first nitride semiconductor layer is exposed, forming a second nitride semiconductor layer by selective growth from the first nitride semiconductor layer at a crystal growth starting temperature, and continuing crystal growth at a temperature higher than the crystal growth starting temperature.

The process of the present invention usually employs a sapphire substrate on which the nitride semiconductor is formed. However, it does not preclude using any other substrate or nitride semiconductor substrate.

The first nitride semiconductor layer is formed on a substrate with or without a buffer layer interposed between them. The nitride semiconductor may be compound semiconductor such as gallium nitride (GaN), aluminum nitride (AlN), indium nitride (InN), indium-gallium nitride (InGaN), and aluminum-gallium nitride (AlGaN). Preferable among them is gallium nitride compound semiconductor. It is desirable that the first nitride semiconductor layer have a wurtzite crystal structure. Incidentally, InGaN, AlGaN, GaN, etc. used in the present invention do not necessarily denote a pure ternary or binary compound crystal; they may contain a slight amount of impurity (such as Al in InGaN, for example) not harmful to their performance. Such nitrides are also within the scope of the present invention. The term "first layer" simply means that another layer is formed thereon afterward. Therefore, a nitride semiconductor layer may be formed before the first nitride semiconductor layer. In the case where the substrate is partly or entirely a nitride semiconductor, the surface of the substrate may function as the first nitride semiconductor layer.

The first nitride semiconductor layer may be formed by a variety of vapor phase growth methods, such as organometallic vapor phase epitaxy (MOCVD or OMVPE), molecular beam epitaxy (MBE), and hydride vapor phase epitaxy (HVPE). Of these methods, OMVPE is desirable because it rapidly gives a layer with good crystal properties. OMVPE employs TMG (trimethylgallium) or TEG (triethylgallium) as the Ga source, TMA (trimethylaluminum) or TEA (triethylaluminum) as the aluminum source, TMI (trimethylindium) or TEI (triethylindium) as the In source, and ammonia or hydrazine as the nitrogen source. The impurity source is exemplified by silane gas for Si, germane gas for Ge, Cp2Mg (cyclopentadienyl magnesium) for Mg, and diethylzinc (DEZ) for Zn. To carry out OMVPE, these gases are supplied to the substrate surface which is heated to 600° C. or above, so that they, upon pyrolysis, form an InAlGaN compound semiconductor by epitaxial growth.

According to the present invention, the first nitride layer is covered with a protective film of silicon oxide or silicon nitride which prevents the crystal growth. The protective film varies in thickness depending on the size of the window regions to be formed and the material of the semiconductor layer. The thickness ranges from about 5 nm to about 50 nm, preferably from about 10 nm to about 30 nm. In the protective film are formed window regions of desired size and shape. The number of window regions may be one or more, and the size and shape of window regions may be uniform or varied. The shape may be stripe, lattice, round, ellipse, square, hexagon, triangle, rectangle, rhombus, or other regular or irregular polygons. The opening of window regions may be tapered or inclined.

The window regions made in the protective film permit the first nitride semiconductor layer to be exposed through them. The second nitride semiconductor layer is formed on the exposed parts of the first nitride semiconductor layer. The forming temperature is comparatively low (1020° C. or below, preferably 400° C. to 980° C.) in the initial stage, and it is raised to 950° C. or above in the subsequent stage. The two-stage process in the present invention differs from the conventional one in which the first nitride semiconductor layer is formed at 1000° C. or above and the second nitride semiconductor layer is formed at 1000° C. or above so as to avoid deposition on the protective film. Unfortunately, deposition at 1000° C. or above prevents the growth from the regions which are not covered by the protective film. This disadvantage is eliminated by starting the process at 1020° C. or below and then raising the temperature afterward. The initial step at a comparatively low temperature (1020° C. or below) prevents the evaporation of the reactant gas in the window regions more effectively than in the case where the temperature is high. As the result, the second nitride semiconductor layer is formed uniformly and efficiently in response to the supplied reactant gas.

The forming temperature for the second nitride semiconductor layer in the second stage may be raised when the layer thickness has exceeded 30 nm, preferably 100 nm in the vertical direction from main surface of the substrate, or the thickness of the protective film. The temperature may be lowered and raised again, or the lowering and raising may be repeated. The layer growth may be interrupted or continued while the temperature is being lowered or raised. The temperature rise may be steep or mild or stepwise. The layer growth at a low temperature and the layer growth at a raised temperature may be carried out by using the same apparatus (chamber) or different apparatus. The substrate temperature is controlled by an adequate heating means, such as energy beam irradiation.

According to the present invention, the forming temperature should be raised in such a way that the difference between the initial forming temperature and the raised temperature is 20° C. or more. If this requirement is not met, the condition for low evaporation in the initial stage remains, thereby resulting in a large amount of deposition on the protective film in the subsequent stage of crystal growth. If the temperature difference is 20° C. or below, the resulting deposit is polycrystalline or amorphous and such deposit adversely affects the quality of the nitride semiconductor crystals that grow through the window regions in the protective film.

According to the present invention, the process for vapor phase growth of nitride semiconductor comprises forming a first nitride semiconductor layer on a substrate, forming thereon a protective film for crystal growth prevention in such a way that it has partly open window regions through which the first nitride semiconductor layer is exposed, forming a second nitride semiconductor layer by selective growth from the first nitride semiconductor layer in such a state that the nitride semiconductor is released at a low level on the surface of the first nitride semiconductor layer or the second nitride semiconductor layer, and continuing crystal growth in such a state that the nitride semiconductor is released on the surface of the second nitride semiconductor layer at a higher level than at the time of start of crystal growth.

The present invention is characterized in that the vapor phase growth of nitride semiconductor is carried out in two stages. In the first stage, the nitride semiconductor is released at a low level on the surface of the nitride semiconductor layer, and in the second stage, the nitride semiconductor is released at a high level on the surface of the nitride semiconductor layer. The level of release may be controlled by temperature, pressure, kind and flow rate of gas, local activation with laser or energy beam irradiation, or introduction of plasma or electromagnetic wave (microwave).

If the nitride semiconductor is in a low release level, the crystal growth proceeds fast in proportion to the supply of the reactant gas and hence proceeds steadily in the window regions. By contrast, if the nitride semiconductor is in a high release level, the crystal growth proceeds selectively. Therefore, the two-stage process mentioned above permits crystals to grow through minute window regions in the initial stage and then permits crystals to grow from the previously grown crystals in the subsequent stage. In this way it is possible to carry out uniform and reproducible crystal growth.

The invention will be described with reference to the following examples, in which the vapor phase growth of nitride semiconductor is applied to the production of semiconductor light-emitting elements. The elements produced by the present invention are not limited to semiconductor light-emitting elements such as light-emitting diode and semiconductor laser. They include semiconductor laser devices in which facets are used for cavity surface or current constriction, light-emitting devices or electronic devices in which elements are isolated from one another by the selective growth, and quantum devices which employ the low-dimensional structure that appears on the facet or the vertex or edge formed by the facets. The process of the present invention may be modified or changed without departing from the scope thereof. The present invention is not limited to the following examples.

EXAMPLE 1

This example will be explained with reference to FIGS. 1 and 3. In FIG. 1A, there is shown a sapphire substrate 10 whose principal plane is the $C^+$ plane. On the substrate is grown an epitaxial GaN layer 11 (about 2 $\mu$m thick) by organometallic vapor phase epitaxy. This GaN layer 11 is the first nitride semiconductor layer.

Figure 1B:
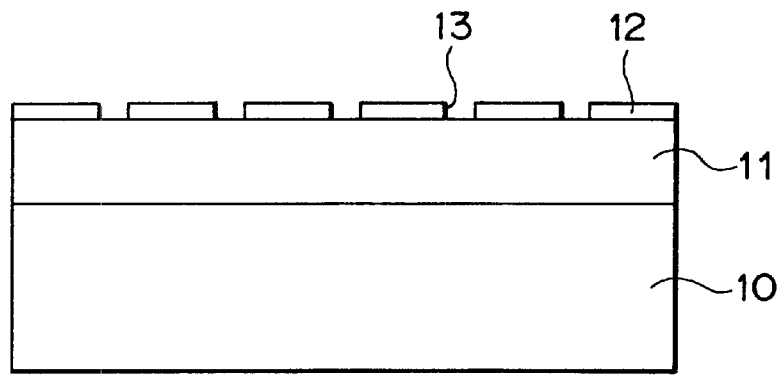

On the GaN layer 11 is formed a protective film 12 of $SiO_2$ (about 20 nm thick) as shown in FIG. 1B. This protective film prevents crystals from growing thereon in the stage of selective crystal growth. In this protective film 12 are formed window regions 13 by photolithography. The surface of the underlying GaN layer 11 is exposed through the window regions 13 (openings) in the protective film 12.

Then, the wafer or the sapphire substrate 10 having the window regions 13 is placed in an apparatus for organometallic vapor phase epitaxy. The apparatus is supplied with ammonia as a nitrogen source, trimethylgallium as a Ga source, and hydrogen and nitrogen as a carrier gas so as to grow GaN on the wafer. The temperature for crystal growth is 980° C. (low temperature) initially, and five minutes later, it is raised to 1020° C. (high temperature).

Figure 1C:
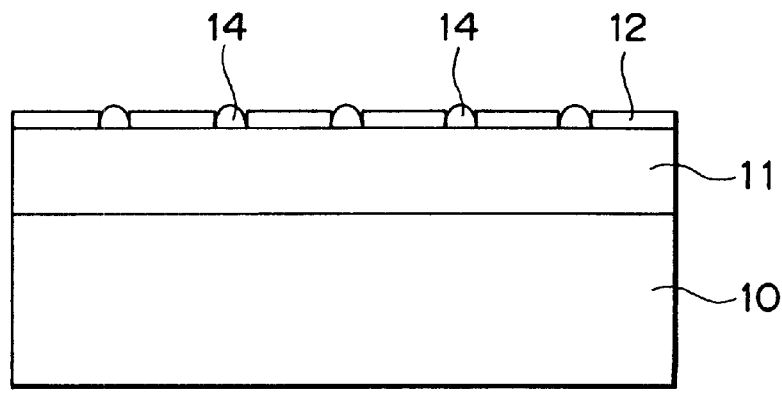

FIG. 1C shows the GaN layer 14 which has just begun to grow at the low temperature. It is to be noted that the GaN layer 14 does not grow on the protective film 12 but grows from the surface of the underlying GaN layer 11 through the window regions 13 in the protective film 12. Since the selective crystal growth takes place at a comparatively low temperature, the nitride semiconductor in the window regions is less released than at a high temperature. Thus the GaN layer as the second nitride semiconductor layer is deposited efficiently relative to the amount of the reactant gas supplied.

Figure 2A:
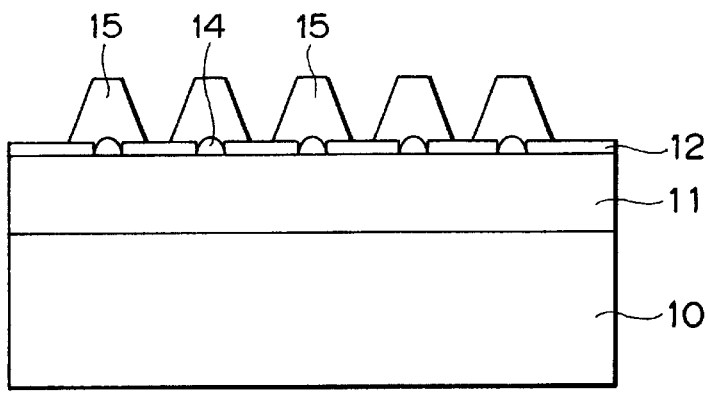
FIGS. 2A and 2B are schematic diagrams to illustrate the steps of vapor phase growth for the nitride semiconductor in Example 1 of the present invention.

The growing of the GaN layer 14 at a low temperature is followed by the growing of the GaN layer 15 in the vertical and lateral directions at a high temperature as shown in FIG. 2A. This step uses the GaN layer 14, which has previously been formed at a low temperature, as seed crystal. Owing to the uniform GaN layer 14 resulting from crystal growth at a low temperature, the GaN layer 14 grows uniformly, too. The GaN layer 15 is formed at a high temperature, say, 1020° C. The temperature is identical with that for the conventional selective growth. "High temperature" used for the GaN layer 15 is relative to "low temperature" used for the GaN layer 14.

Figure 2B:
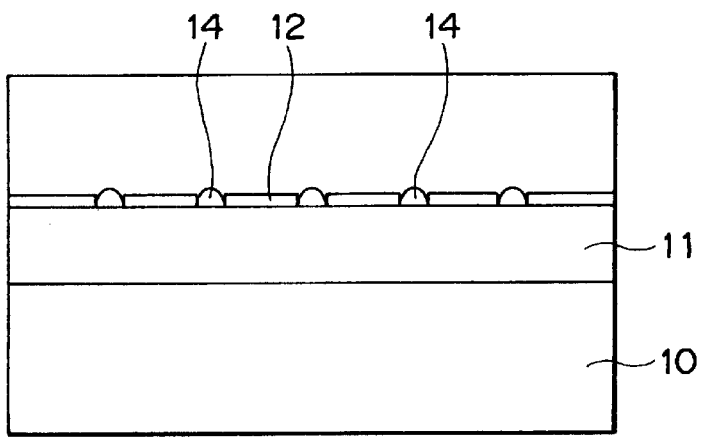

FIG. 2B is a sectional view of the sample in which the GaN layer 15 has grown further at a high temperature. The GaN layer 15 as the second nitride semiconductor layer has good crystalline characteristics despite the fact that there exist threading dislocations in the GaN layer 11 on the sapphire substrate 10. This is because the lateral growth of the GaN layer 15 isolates the threading dislocations. The uniformity of the GaN layer 15 formed at a high temperature is ascribed to the uniformity of the GaN layer 14 formed at a low temperature.

Figure 3:
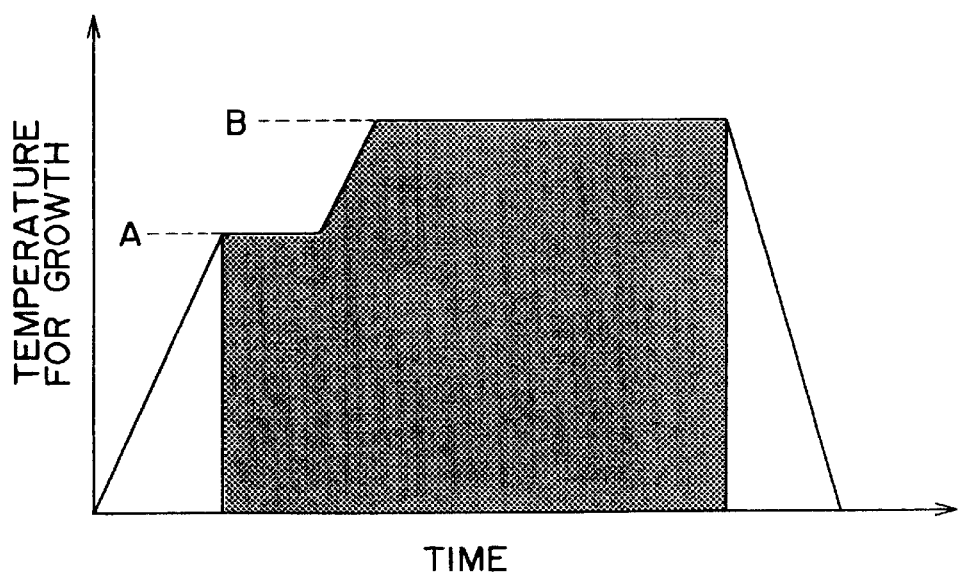
FIG. 3 is a time-temperature diagram to illustrate how temperature is controlled for vapor phase growth of the nitride semiconductor according to the present invention.

FIG. 3 is a diagram showing how temperature is controlled with time in this example. The crystal growth starts at a comparatively low temperature A, and the crystal growth continues at a comparatively high temperature B. The temperature control in this manner contributes to the uniform GaN layer having good crystal characteristics. The temperature A should be 1020° C. or lower, preferably in the range of 400° C. to 980° C. The temperature B should preferably be 950° C. or higher. An example of the temperature A is 980° C. and an example of the temperature B is 1020° C. Controlling the temperature as mentioned above may be viewed as controlling the released state of the nitride semiconductor. In other words, switching from a low temperature to a high temperature is equivalent to switching from a low released state to a high released state.

In this example, the GaN layer 14 grown at a low temperature is formed in the initial stage of forming the second nitride semiconductor layer. It should be 30 nm or thicker, or thicker than the thickness of the protective film 12, as measured in the vertical direction from the principal plane of the substrate. When the GaN layer 14 has grown in excess of this thickness, the temperature is raised. If the thickness is 30 nm or smaller, the GaN layer 14 will not grow smoothly in the lateral direction. The thickness should preferably be 30 nm or larger so that the second nitride semiconductor grows again adequately. Moreover, the condition for good crystal characteristics is that the thickness of the GaN layer 14 be larger than the thickness of the protective film 12. This condition readily permits crystal growth in the lateral direction.

In this example, the vapor phase growth of the nitride semiconductor is carried out in such a way that the crystal growth for the GaN layer starts at a comparatively low temperature and the crystal growth continues at a comparatively high temperature. This procedure gives rise to a uniform GaN layer having good crystal characteristics. Although this example demonstrates the growing of the GaN layer as the nitride semiconductor layer, the nitride is not limited to GaN but it includes AlN, InN, BN, and TaN, which may contain a slight amount of impurities.

EXAMPLE 2

This example demonstrates the comparison between the vapor phase growth of nitride semiconductor by the process of the present invention and the vapor phase growth of nitride semiconductor by the conventional process. This example employs the window regions in stripe shape.

Figure 4A:
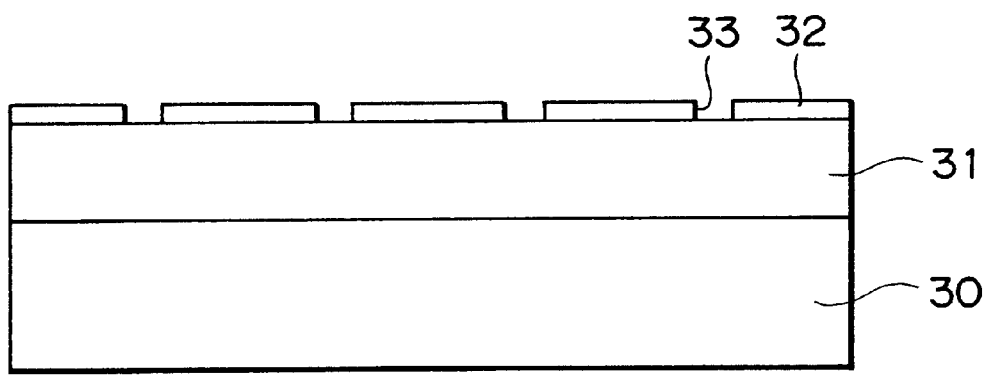
FIGS. 4A and 4B are schematic diagrams to illustrate the steps of vapor phase growth for the nitride semiconductor in Example 2 of the present invention.

The process in this example starts with forming a GaN epitaxial layer 31 (2 $\mu$m thick) on the C-plane of the sapphire substrate 30 by organometallic vapor phase epitaxy. Then, on this GaN epitaxial layer 31 is formed a protective layer 32 of $SiO_2$ (about 20 nm thick). See FIG. 4A.

Figure 4B:
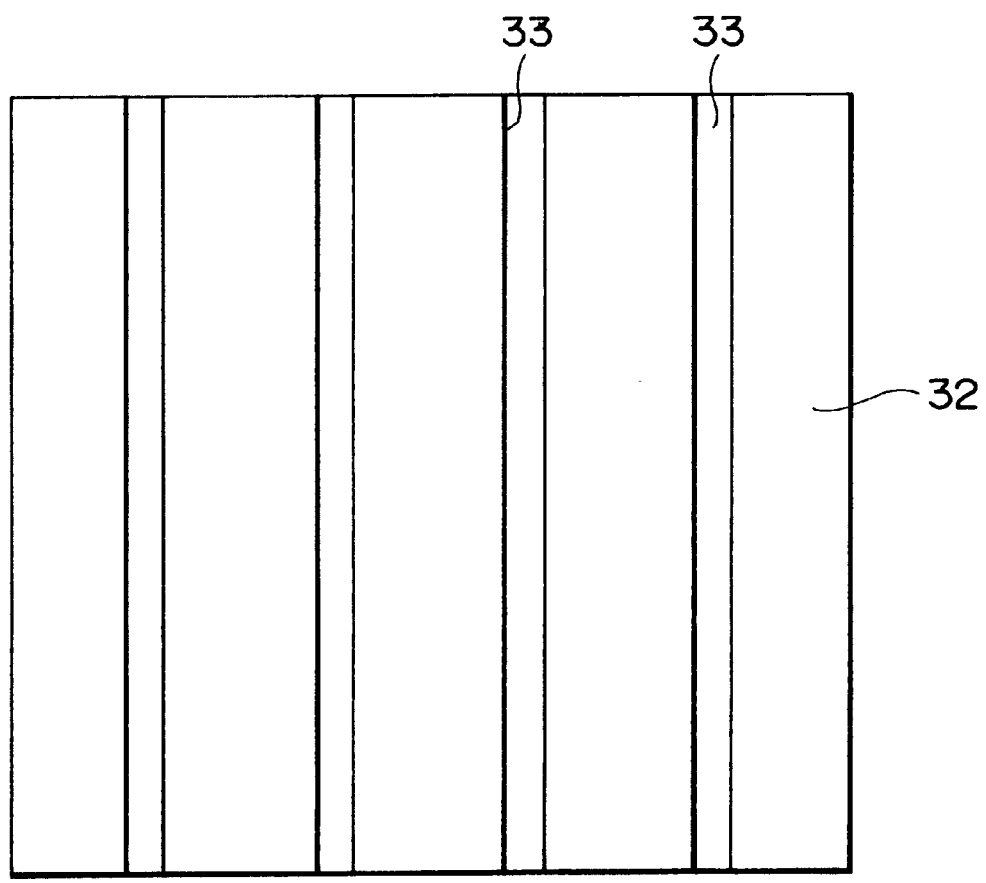

On the protective film 32 are formed stripy window regions 33 which extend in the <1, −1, 0, 0> direction of gallium nitride of wurtzite structure, as shown in FIG. 4B. The width of the stripe is 2, 3, 5, or 10 $\mu$m, and the distance between adjacent stripes is six times the width of the stripe. The wafer is placed in an apparatus for organometallic vapor phase epitaxy. The apparatus is supplied with ammonia as a nitrogen source, trimethylgallium as a gallium source, and hydrogen and nitrogen as a carrier gas. GaN is grown for 30 minutes.

In this example, the vapor phase growth of nitride semiconductor was started at 980° C. and continued for 5 minutes at 980° C. Then, the temperature was raised to 1020° C. and the vapor phase growth was continued for 25 minutes. The total growing period was 30 minutes. It was found that the nitride semiconductor grew uniformly through the window regions 33 where there exists no protective film 32 regardless of the stripe width. Regular growth through window regions as narrow as 2 $\mu$m was noticed. Thus, the process of the present invention makes it possible to grow GaN in two stages through narrow window regions on the underlying GaN layer. In other words, the process of the present invention permits the crystal growth of gallium nitride compound semiconductor having a low density of threading dislocations. The crystals that have grown through the window regions grow further until they eventually form a flat film as shown in FIG. 2B. This step proceeds uniformly with good reproducibility.

For comparison, the same procedure as above was repeated except that the temperature was kept constant at 1020° C. throughout the entire steps (for 30 minutes). It was found that crystal growth at such a high temperature takes place unevenly in limited parts of stripy window regions. Crystals hardly grew in the window regions 2 $\mu$m or narrower. This result suggests that crystal growth at 1020° C. through narrow window regions present difficulties in reducing the density of threading dislocations in the regrown GaN layer.

Although this example has demonstrated the procedure for stripes in the <1, −1, 0, 0> direction of wurtzite crystal structure, the same effect as above will be produced even in the case of stripes in other directions.

EXAMPLE 3

This example is intended to show the difference between the vapor phase growth of nitride semiconductor according to the present invention and the vapor phase growth of nitride semiconductor according to the conventional technology. The process in this example employs hexagonal window regions.

Figure 5A:
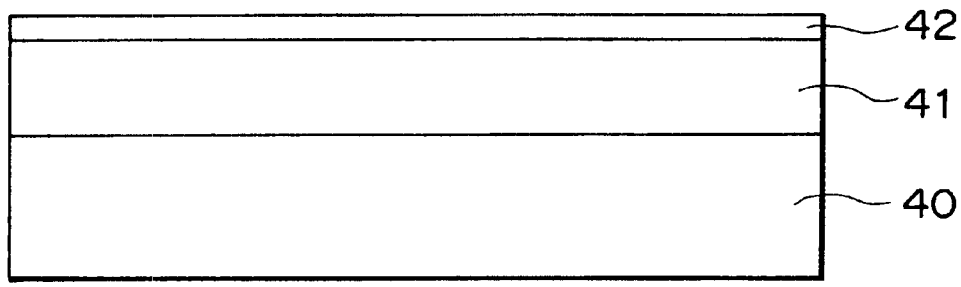
FIGS. 5A and 5B are schematic diagrams to illustrate the steps of vapor phase growth for the nitride semiconductor in Example 3 of the present invention.
Figure 5B:
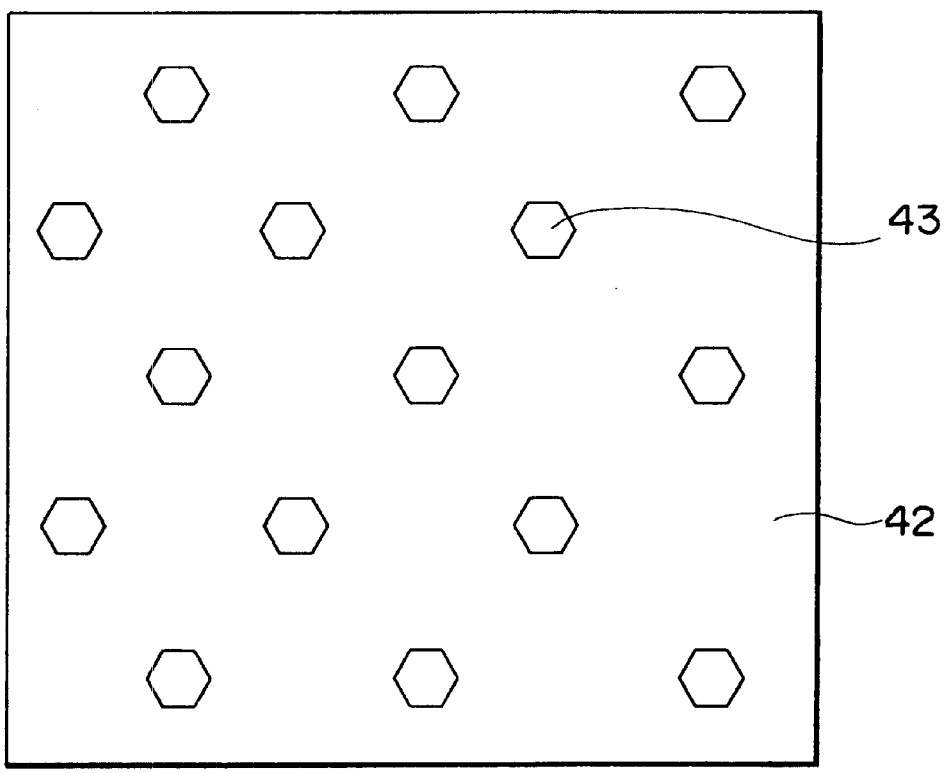

On the C-plane of a sapphire substrate 40 is grown a GaN epitaxial layer 41 (2 $\mu$m thick) by organometallic vapor phase epitaxy. On this GaN layer is formed a protective film 42 of $SiO_2$ (about 20 nm thick) as shown in FIG. 5A. In this protective film 42 are formed hexagonal window regions 43. The wafer is placed in an apparatus for organometallic vapor phase epitaxy. The apparatus is supplied with ammonia as a nitrogen source, trimethylgallium as a gallium source, and hydrogen and nitrogen as a carrier gas. GaN is grown for 30 minutes.

In this example, the vapor phase growth of nitride semiconductor was started at 980° C. and continued for 5 minutes at 980° C. Then, the temperature was raised to 1020° C. and the vapor phase growth was continued for 25 minutes. The total growing period was 30 minutes. It was found that the nitride semiconductor grew uniformly through the window regions 43 where there exists no protective film 42. It was also found that this selective growth is useful for the uniform and reproducible production of three-dimensional elements.

For comparison, the same procedure as above was repeated except that the temperature was kept constant at 1020° C. throughout the entire steps (for 30 minutes) according to the conventional technology. It was found that GaN crystals in the shape of hexagonal pyramid having six (1, −1, 0, 1) planes grew through the window regions 43 in the protective film 42 but very few crystals grew on the protective film on account of the high temperature. The resulting crystals are not necessarily good in size, shape, uniformity, and reproducibility. The foregoing suggests that crystal growth at 1020° C. present difficulties in reducing the density of threading dislocations in the regrown GaN layer if the window regions are made smaller.

The hexagonal window regions in this example may be replaced with round or other polygonal ones to produce the effect of the present invention.

In the above-mentioned examples, it is assumed that the first nitride semiconductor layer is an epitaxially grown GaN layer; however, any substrate, such as GaN substrate, which has a nitride at least in its surface, may be utilized as the first nitride semiconductor layer.

According to the present invention, the process for vapor phase growth of nitride semiconductor is characterized by temperature control in two stages. The process with temperature control makes it possible to grow crystals uniformly with good reproducibility and to reduce the area of window regions in the protective film. In addition, the process gives the second nitride semiconductor layer which has a reduced density of threading dislocations. This contributes to long-life and high-performance semiconductor devices. The uniform crystal growth helps produce semiconductor devices separated by protective film. The three dimensional shape that appears during crystal growth helps produce devices which are uniform in the wafer.

What is claimed is:

1. A process for vapor phase growth of nitride semiconductor which comprises forming a first nitride semiconductor layer on a substrate, forming thereon a protective film for crystal growth prevention in such a way that it has partly open window regions through which said first nitride semiconductor is exposed, forming a second nitride semiconductor layer by selective growth from said first nitride semiconductor layer at a crystal growth starting temperature until the second layer exceeds the depth of the window by an amount effective to promote lateral growth in subsequent crystal growth, and continuing crystal growth at a temperature higher than the crystal growth starting temperature.

2. A process for vapor phase growth of nitride semiconductor as defined in claim 1, wherein the crystal growth starting temperature is 1020° C. or lower.

3. A process for vapor phase growth of nitride semiconductor as defined in claim 1, wherein the growing temperature after temperature rise is 950° C. or higher.

4. A process for vapor phase growth of nitride semiconductor as defined in claim 1, wherein the growing temperature is raised after the second nitride semiconductor layer has grown in excess of 30 nm or the thickness of the protective film in the vertical direction from the principal plane of the substrate.

5. A process for vapor phase growth of nitride semiconductor as defined in claim 1, wherein the second nitride semiconductor layer is a gallium nitride compound semiconductor layer.

6. A process for vapor phase growth of nitride semiconductor as defined in claim 1, wherein the window regions in the protective film have a size in the range of 0.5 $\mu$m to 20 $\mu$m.

7. A process for vapor phase growth of nitride semiconductor as defined in claim 1, wherein the difference between the crystal growth starting temperature and the raised crystal growth temperature is 20° C. or larger.

8. A process for vapor phase growth of nitride semiconductor as defined in claim 1, wherein the protective film does not exceed in excess of 20 nm or thicker.

9. A process for vapor phase growth of nitride semiconductor which comprises forming a first nitride semiconductor layer on a substrate, forming thereon a protective film for crystal growth prevention in such a way that it has partly open window regions through which said first nitride semiconductor is exposed, forming a second nitride semiconductor layer by selective growth from said first nitride semiconductor in such a state that the nitride semiconductor is released at a low level on the surface of said first nitride semiconductor layer or said second nitride semiconductor layer until the second layer exceeds the depth of the window by an amount effective to promote lateral growth in subsequent crystal growth, and continuing crystal growth in such a state that the nitride semiconductor is released on the surface of said second nitride semiconductor layer at a higher level than at the time of start of crystal growth.

10. A process for vapor phase growth of nitride semiconductor as defined in claim 9, wherein the second nitride semiconductor layer is a gallium nitride compound semiconductor layer and the reactant gas for said crystal growth consists of trimethylgallium or triethylgallium and ammonia.

11. A process for vapor phase growth of nitride semiconductor as defined in claim 9, wherein the protective film does not exceed in excess of 20 nm or thicker.

\* \* \* \* \*